(12) United States Patent
Bhowmik et al.

(10) Patent No.: US 7,071,563 B2
(45) Date of Patent: Jul. 4, 2006

(54) BARRIER LAYER FOR INTERCONNECT STRUCTURES OF A SEMICONDUCTOR WAFER AND METHOD FOR DEPOSITING THE BARRIER LAYER

(75) Inventors: Siddhartha Bhowmik, Allentown, PA (US); Sailesh Mansinh Merchant, Orlando, FL (US); Darrell L. Simpson, Gotha, FL (US)

(73) Assignee: Agere Systems, Inc., Allentown, PA (US)

( * ) Notice: Subject to any disclaimer, the term of this patent is extended or adjusted under 35 U.S.C. 154(b) by 511 days.

(21) Appl. No.: 09/967,094

(22) Filed: Sep. 28, 2001

(65) Prior Publication Data

US 2003/0062626 A1    Apr. 3, 2003

(51) Int. Cl.
*H01L 21/4763*    (2006.01)
(52) U.S. Cl. ............ 257/774; 257/751; 257/763; 257/770; 257/771; 257/772; 257/773; 438/700; 438/629; 438/672; 438/978
(58) Field of Classification Search ............ 257/764, 257/771, 774, 751, 763, 773, 775; 438/623, 438/624, 627, 639, 649, 712, 694, 720, 721
See application file for complete search history.

(56) References Cited

U.S. PATENT DOCUMENTS

| | | | |
|---|---|---|---|
| 4,647,361 A * | 3/1987 | Bauer | 204/298.09 |
| 4,851,369 A | 7/1989 | Ellwanger et al. | |
| 4,927,786 A * | 5/1990 | Nishida | 438/488 |
| 5,229,323 A * | 7/1993 | Shimada et al. | 438/522 |
| 5,600,182 A | 2/1997 | Schinella et al. | |
| 5,604,140 A | 2/1997 | Byun et al. | |
| 5,604,158 A * | 2/1997 | Cadien et al. | 437/200 |
| 5,672,543 A * | 9/1997 | Chang et al. | 437/192 |
| 5,847,463 A | 12/1998 | Trivedi et al. | |
| 5,956,609 A * | 9/1999 | Lee et al. | 438/627 |
| 5,981,380 A * | 11/1999 | Trivedi et al. | 438/639 |

(Continued)

FOREIGN PATENT DOCUMENTS

JP          64-064318        3/1989

(Continued)

OTHER PUBLICATIONS

Applied Materials, Inc., *Vectra IMP Optimization & Troubleshooting—Student Guide*, Version P, Jan. 22, 1999, pp. (i) through 3-16, Santa Clara, CA, USA.

(Continued)

*Primary Examiner*—Nathan J. Flynn
*Assistant Examiner*—Fazli Erdem

(57) ABSTRACT

An interconnect structure of a semiconductor device includes a tungsten plug (14) deposited in a via or contact window (11). A barrier layer (15) separates the tungsten plug (14) from the surface of a dielectric material (16) within which the contact window or via (11) is formed. The barrier layer (15) is a composite of at least two films. The first film formed on the surface of the dielectric material (16) within the via (11) is a tungsten silicide film (12). The second film is a tungsten film (13) formed on the tungsten silicide film (12). A tungsten plug (14) is formed on the tungsten film (13) to complete interconnect structure. The barrier layer (15) is deposited using a sputtering technique performed in a deposition chamber. The chamber includes tungsten silicide target (19) from which the tungsten silicide film (12) is deposited, and a tungsten coil (20) from which the tungsten film (20) is deposited.

9 Claims, 6 Drawing Sheets

U.S. PATENT DOCUMENTS

| | | | | |
|---|---|---|---|---|
| 5,985,749 | A * | 11/1999 | Lin et al. | 438/623 |
| 6,022,800 | A | 2/2000 | Ho et al. | |
| 6,037,263 | A * | 3/2000 | Chang | 438/712 |
| 6,087,257 | A * | 7/2000 | Park et al. | 438/675 |
| 6,144,097 | A * | 11/2000 | Asahina et al. | 257/751 |
| 6,194,304 | B1 * | 2/2001 | Morozumi et al. | 438/618 |
| 6,372,633 | B1 * | 4/2002 | Maydan et al. | 438/637 |
| 6,375,552 | B1 * | 4/2002 | Cadien et al. | 451/41 |
| 2002/0132473 | A1 * | 9/2002 | Chiang et al. | 438/643 |
| 2002/0144889 | A1 * | 10/2002 | Tao et al. | 204/192.12 |

FOREIGN PATENT DOCUMENTS

| | | | |
|---|---|---|---|
| JP | 64-064318 | * | 10/1989 |
| JP | 5129226 | | 5/1993 |

OTHER PUBLICATIONS

S. Wolf and R.N. Tauber, *Silicon Processing for VLSI Era, vol. 1—Process Technology*, pp. 475-485, Second Edition (2000), Published by Lattice Press, Sunset Beach, California.

* cited by examiner

BARRIER LAYER FOR INTERCONNECT STRUCTURES OF A SEMICONDUCTOR WAFER AND METHOD FOR DEPOSITING THE BARRIER LAYER

BACKGROUND OF THE INVENTION

This invention relates generally to the fabrication of semiconductor wafers and/or integrated circuit ("IC chips") devices, and more specifically to the fabrication of metalization layers or interconnect structures. The present invention also pertains to the deposition of thin film layers and tungsten (W) plugs in contact holes or vias of interconnect structures.

Thin films serve a variety of different functions in the manufacture of semiconductor wafers and/or IC devices. For example, thin films are used in the construction of interconnect structures having contact holes and vias. Interconnect structures are those structures on an integrated circuit device that connect different levels of a multi-level IC device, and include contact holes and vias. Contact holes are holes in PMD (pre-metal dielectric) active regions, such as the source region and drain region of a silicon substrate, and a metal layer. Contact holes allow electrical connections between a metal layer and the polysilicon and/or the silicon wafer substrate. Vias allow contact between different metal layers on the device.

Of those refractory metals considered as interconnect materials, tungsten has been the most widely used because of its high thermal stability, low stress, excellent step conformity and because its thermal expansion coefficient closely matches that of silicon. Because of its lower conductivity, tungsten is used for shorter interconnect paths while copper and aluminum are used for global interconnect paths.

Chemical vapor deposition is one process for applying tungsten to a wafer surface and/or an IC device to fill the contact holes and vias. Prior to deposition of the tungsten on the wafer surface within a hole or via, a contact layer and an adhesion/barrier layer are applied to the wafer surface including the hole or via. A titanium (Ti) thin film is first applied as the contact layer because of its adherence to dielectric materials that comprise the wafer or IC device.

Titanium may be applied using a physical vapor deposition (PVD) process commonly referred to as sputtering. A conventional PVD chamber is illustrated in FIG. 1. The components of the PVD chamber 30 include a titanium target 33 as a source of the Ti for sputtering. A semiconductor wafer 31 is supported on a pedestal 32 within the chamber. A DC-power source 35 is supplied to the target 33, and an argon (Ar) glow discharge is coupled to the chamber to create a plasma 34 between the target 33 and wafer 31, and to generate a Ti species from the target 33 that will agglomerate on the surface of the wafer 31.

A TiN (titanium nitride) thin film is then deposited on the wafer surface by sputtering in a separate PVD chamber by the injection of nitrogen within the argon glow discharge. The TiN thin film serves as what is known as a nucleation layer or adhesion layer.

The tungsten is deposited as a plug on the TiN thin film to fill the contact hole or via by CVD. Tungsten fluoride ($WF_6$) gas serves as a source for the W-plug. The $WF_6$, gas undergoes a reduction reaction with silane and hydrogen, which results in the deposition of W on the wafer. An etchback or planarization step is then performed to remove excess W outside of the via or contact hole.

With respect to FIG. 2, a defective W-plug is illustrated. A titanium nitride thin film 41 acts as a barrier layer between the Ti contact layer 40 and the W-plug 42 and also serves as a nucleation layer for the formation of the W-plug 42. It is not desirable to apply Tungsten directly to the Ti film 40, because the $WF_6$ source may react with Ti and cause "W-volcanoes" on the wafer surface. The TiN thin film 41 may crack, or have a pinhole, which exposes the Ti to the $WF_6$, which attacks the Ti causing volcanoes 42 to form. As the W continues to form it pushes back the TiN layer exposing more Ti to the reactive $WF_6$. The W forms humps or "volcanoes" 42 that cannot be completely removed by the etchback procedure. In the worst case, these volcanoes produce a zero-yielding semiconductor wafer.

Reduced feature sizes of via, holes and trenches have resulted in increased aspect ratios for the construction of these features. However, the deposition of Ti and TiN using PVD sputtering methods are not adequate to achieve a desired step conformity. A newer PVD procedure known as ionized metal plasma (IMP) deposition has become a popular method of Ti and TiN deposition to achieve the step conformity demanded from the increased aspect ratios of the contact holes and vias.

With respect to FIG. 3, there is schematically illustrated an IMP chamber and steps for deposition of Ti and TiN films. The deposition of Ti and TiN takes place in two separate IMP chambers. In the IMP chamber, several hardware changes are made to a conventional PVD chamber, primarily to increase the bottom coverage of the sputtered atoms in the feature. The IMP chamber includes a tungsten target (Ti target) 50 and a coil (Ti coil) 51. A semiconductor wafer 52 is supported on a pedestal 53. An ionized metal plasma 54 is generated in the IMP chamber, such that the sputtered Ti atoms, for example, ionize and are attracted towards a top surface of the semiconductor wafer, giving improved bottom coverage.

In a conventional PVD chamber, less than 1% of the total sputtered atoms are ionized and the rest are all neutral atoms that form the TI and TiN films. In the IMP chamber, the changes make it possible to increase the ionization probabilities and thus provide improved feature bottom coverage and step conformity. Allowing increased incidences of the number of collisions between the Ar ions and the sputtered Ti increases the number of ionization events. An RF-power activated coil added to the chamber serves as an extra source of electrons, increases the Ar pressure in the chamber, and increases the number of collisions between Ar ions and sputtered Ti. Increased target to wafer spacing also improves the possibility of increased collisions between the Ar ions and sputtered Ti atoms, thus leading to increased ionization events.

The above-described sputtering process is also conducted in separate deposition of TiN on a wafer surface in a separate IMP chamber. Nitrogen is injected into the chamber with argon to form the TiN to be deposited on the wafer surface.

During the TiN deposition phase, TiN films are formed on shields and other parts of the IMP chamber. These TiN films are intrinsically highly stressed and thus prone to particle generation and flaking, which can contaminate a wafer surface and thereby limit yield of semiconductor wafers and/or limit IC device production. In order to avoid this contamination problem, blank or dummy wafers are placed in the IMP chamber. Titanium is deposited to form films covering the TiN film on the chamber shields. This contraceptive measure is known as "pasting", which increases the costs and reduces the cycle time for semiconductor wafer and/or IC chip fabrication. Alternatively, a shutter configuration is often used to deposit Ti onto the shutter such that the chamber and its parts can be effectively "pasted".

Thus, the available deposition procedures for barrier films in contact holes and vias suffer certain shortcomings. The conventional PVD sputtering does not meet the step conformity required with the increased aspect ratios of vias and contact holes. The IMP sputtering of TiN/Ti films create particle contamination and require the additional pasting steps.

SUMMARY OF THE INVENTION

A need exists for a barrier layer, and a method for applying a barrier layer, within a feature such as a contact hole or via of an interconnect structure, including a barrier layer that precludes the frequent pasting steps of the IMP chamber required for the TiN/Ti barrier, and improves product yield by limiting particle generation. The barrier layer must also maintain integrity and serve as a nucleation site for W-plug formation.

The present invention is for a barrier layer for an interconnect structure on an IC device and/or semiconductor wafer. The barrier layer is a multi-film composite comprising a tungsten silicide ($WSi_x$) film and a W film. The compound name tungsten silicide, $WSi_x$, represents the various tungsten silicide compounds that are used for thin films, including $WSi_2$.

Tungsten silicide $WSi_x$ has been used as a film layer for semiconductor wafer and/or IC device fabrication. Specifically, $WSi_x$ is often deposited as a film for polycide gate structures. The preferred method of deposition of the $WSi_x$ is CVD. However, a combination of a $WSi_x$ film and a W film has not been used as a barrier layer for the deposition of W-plugs in vias and contact holes in interconnect structures.

The term "wafer surface," as used in this disclosure, includes the surface of the interconnect structure and dielectric material, within which a recess is formed as a contact hole or via. Thus, the terms "dielectric material surface" and "wafer surface" may be used interchangeably.

The $WSi_x$ film is deposited on the wafer surface within the via or the contact hole. The W film is then deposited on the $WSi_x$ film. The $WSi_x$ film and the W film deposition are conducted within a deposition chamber using either a PVD sputtering technique or an IMP sputtering technique.

The deposition chamber includes a $WSi_x$ target as a source for the sputter deposition of the $WSi_x$ film. The chamber also includes a tungsten coil (W-coil) as a source for the sputter deposition of the W film. Inasmuch as $WSi_x$ coils are not commercially available and/or are difficult to manufacture, a W-coil is used. Tungsten silicide ($WSi_x$) is deposited first on the dielectric surface within the via or contact hole. The W film is then sputtered from the W-coil which results in a net erosion of W from the coil. This procedure may be followed to alternate the films between $WSi_x$ and W. Moreover, a $WSi_x$ gradient may be created within the barrier layer across the W film. When the $WSi_x$ is deposited first, $WSi_x$ deposits on the W-coil. As the W-coil is activated, the $WSi_x$ is sputtered from the coil and agglomerates on the wafer surface creating a $WSi_x$ gradient across the W film. As a result the layers are essentially W-based creating overall low intrinsic stresses and a quasi-epitaxial arrangement.

DETAILED DESCRIPTION OF THE INVENTION

Figure 1:
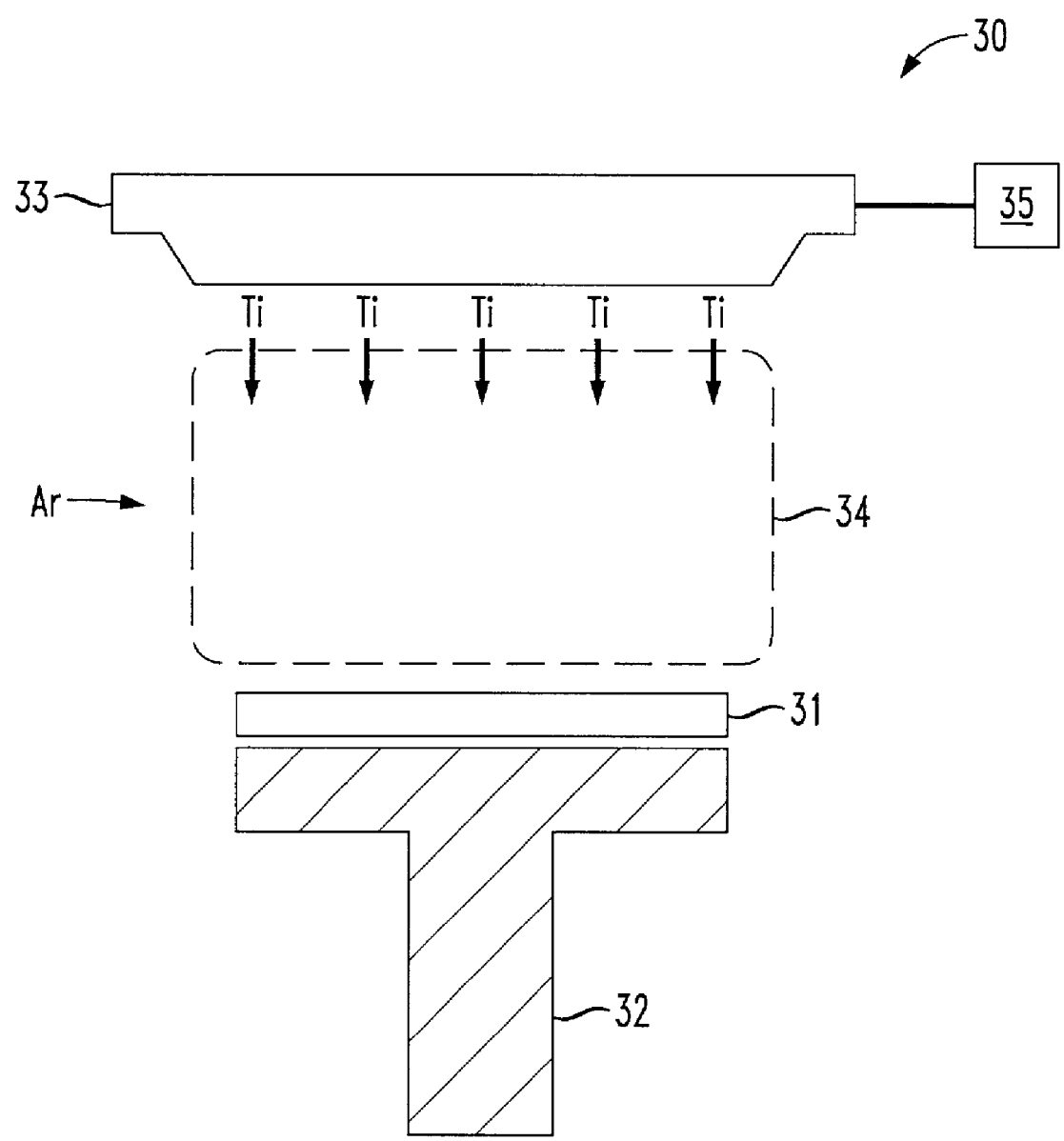
FIG. 1 is a conventional PVD chamber with a Ti target.
Figure 2:
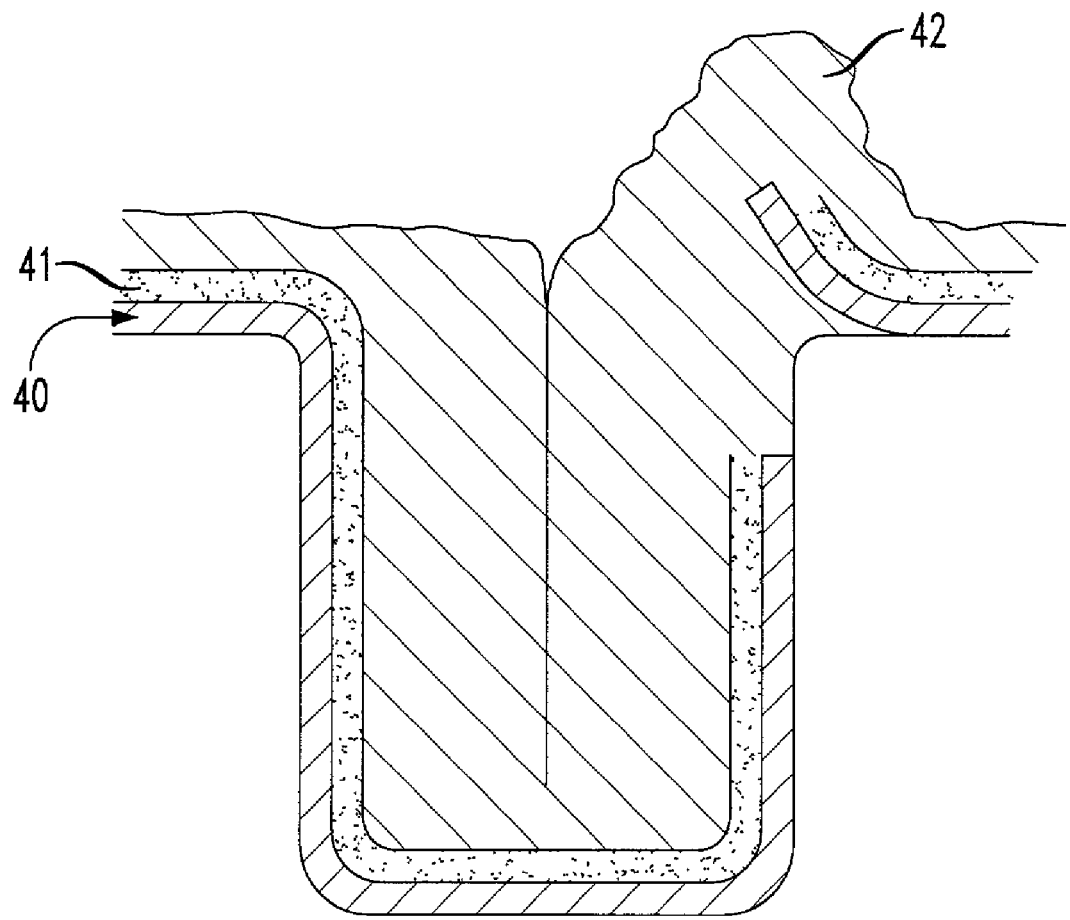
FIG. 2 is a sectional view of a wafer surface with two interconnects structures including W-plugs and "volcano" formed on one structure.
Figure 3:
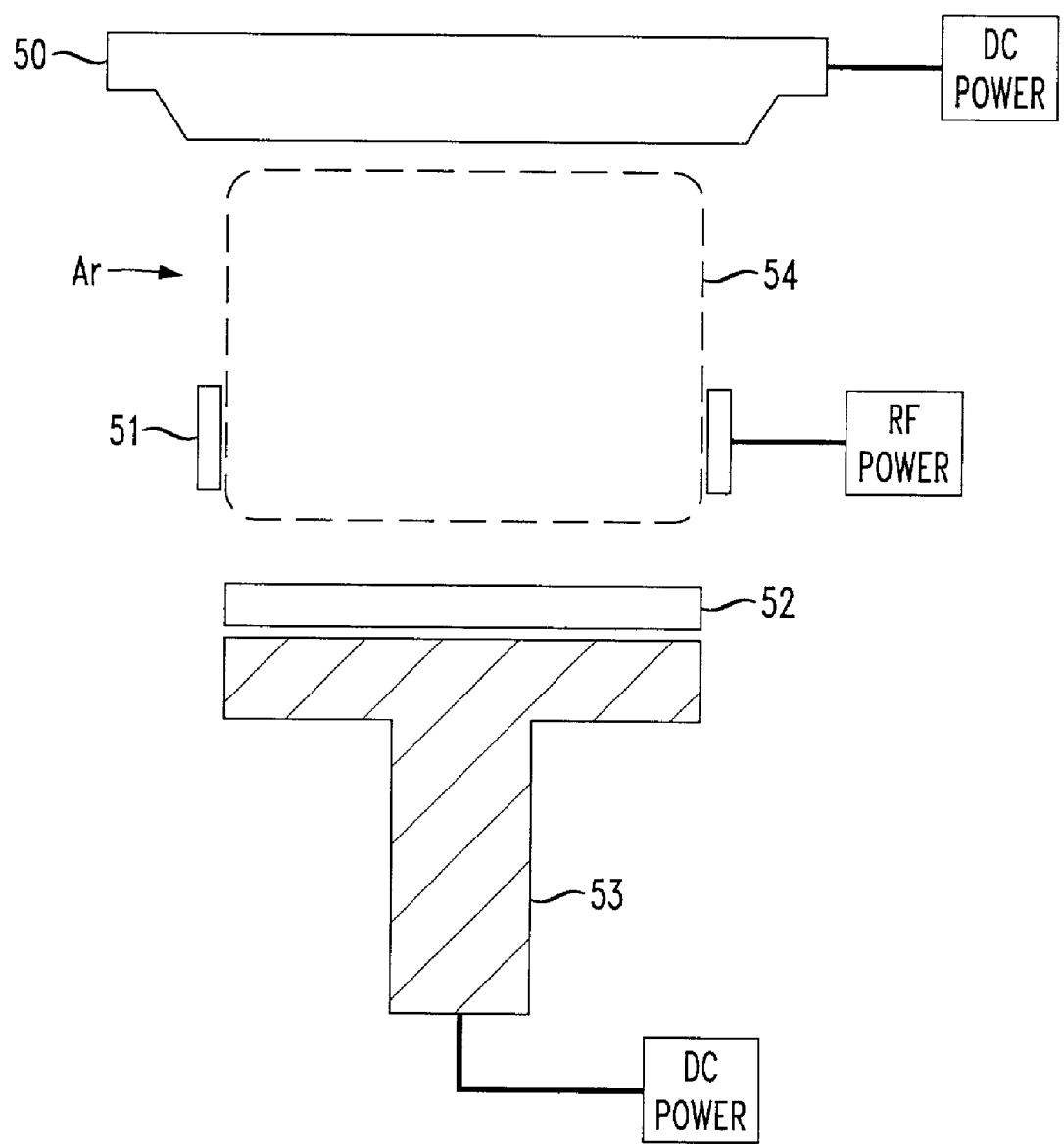
FIG. 3 is an IMP chamber with Ti target and Ti coil, deposition of Ti film.
Figure 4:
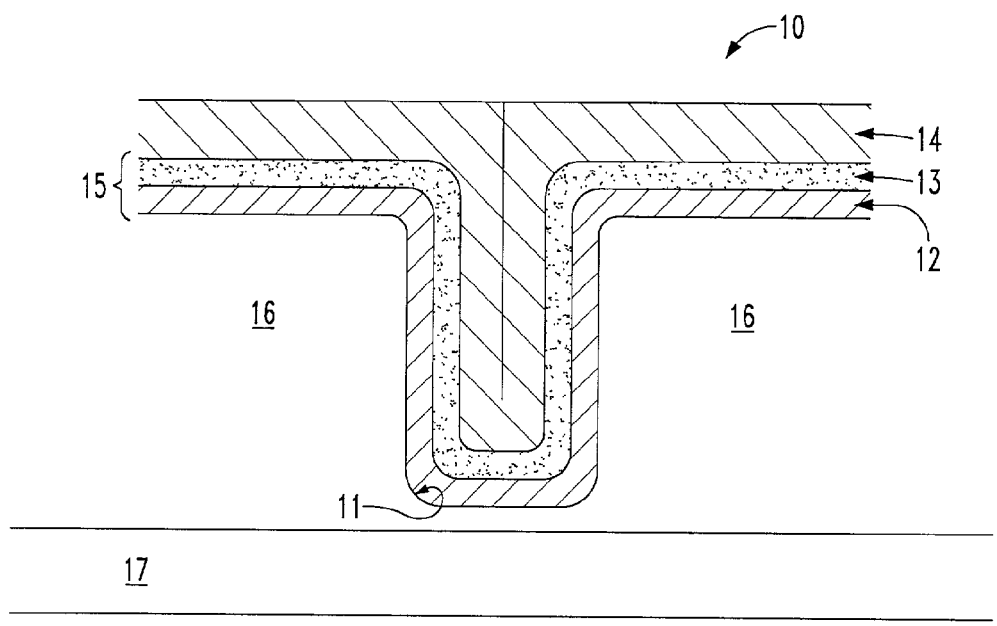
FIG. 4 is a sectional view of the novel barrier layer.
Figure 5:
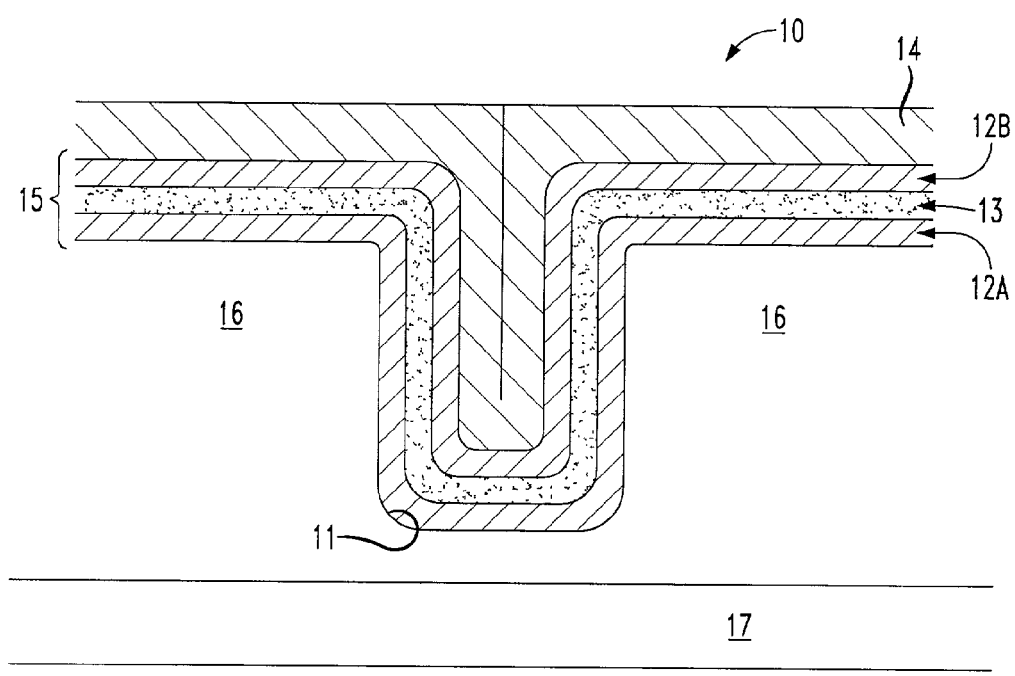
FIG. 5 is a sectional view of the barrier layer with an additional $WSi_x$ film.

With respect to FIGS. 4 and 5, the drawings illustrate an interconnect structure 10 including a dielectric material 16, an underlying metallization area 17, such as a gate, source or drain, and a tungsten plug 14 (hereinafter referred to as a "W-plug") that fills a via or contact hole 11 formed in the dielectric material 16. The barrier layer 15 is a composite of two thin films (or layers). The first film 12 (also referred to as a tungsten silicide film) consists essentially of $WSi_x$ having been deposited along the surface of the dielectric material 16 within the via or contact hole 11, and a second film 13 (also referred to as a tungsten film) consisting essentially of W deposited over the first film 12. The first film 12 and second film 13 are deposited within the via 11 using a sputtering procedure conducted in a deposition chamber, which will be explained in more detail below.

The W-plug 14 is then deposited on the barrier layer 15 (a composite of films 12 and 13) by chemical vapor deposition (CVD), which is known to those in the art. After the W-plug is deposited, an etchback or planarization procedure is used to eliminate excess W and $WSi_x$ from the surface of the dielectric material 16 outside the contact hole or via 11 to form the W-plug 14.

Figure 6:
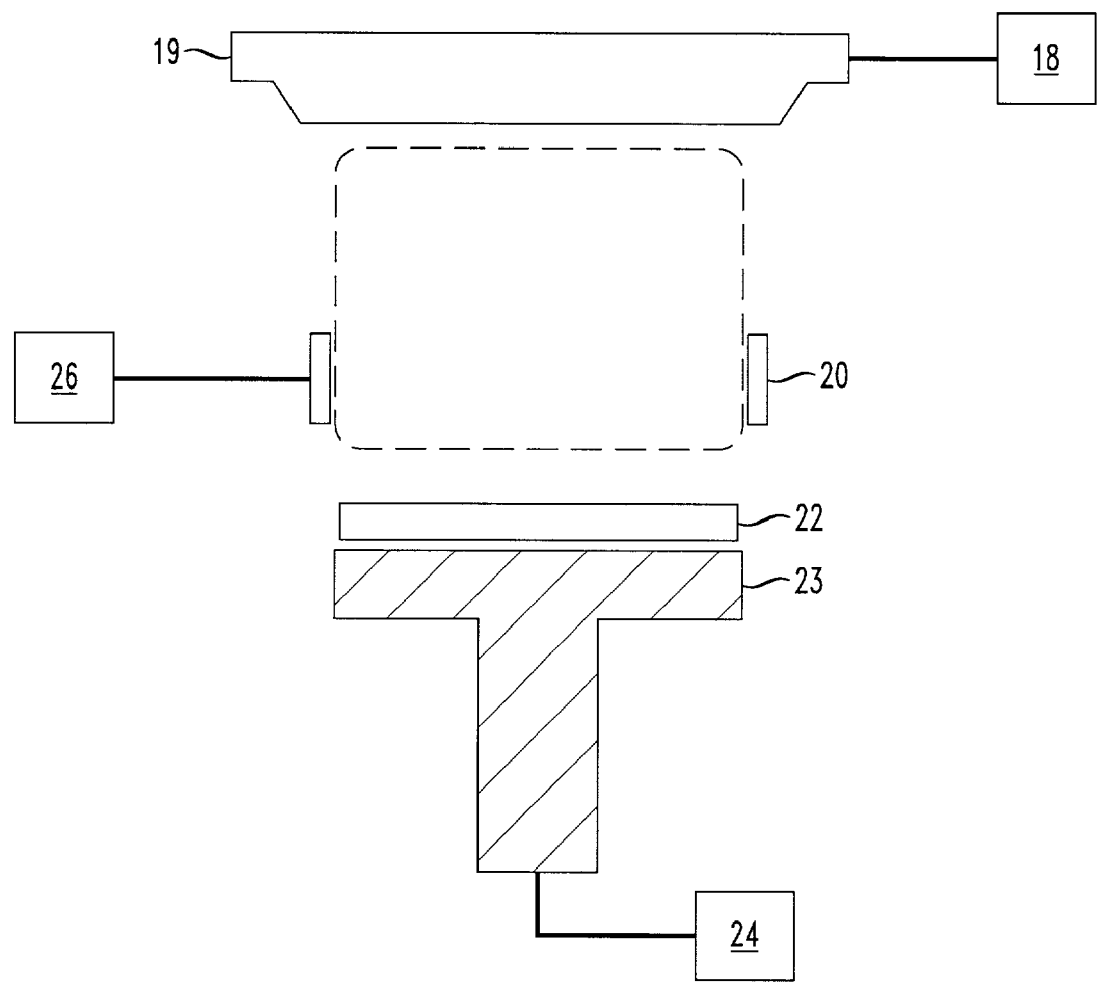
FIG. 6 is an IMP chamber showing the deposition of a $WSi_x$ film.

The deposition of the first film 12 and second film 13 of the barrier layer 15 is conducted within a deposition chamber. With respect to FIG. 6, the deposition chamber is illustrated and includes a $WSi_x$ target 19 (or target 19) and a W-coil 20 (or coil 20). A W-coil 20 is used because $WSi_x$ cannot be effectively formed into a functional coil. The target 19 is supplied with a DC power source 18, and the W-coil 20 is supplied with an RF power source 26, as known to those skilled in the art. A semiconductor wafer 22 is mounted on a pedestal 23, which is connected to a second DC power source 24 to bias a wafer surface 25 for attraction of $WSi_x$ or W species sputtered from the target 19 and coil 20 surfaces.

A plasma 30 is generated in the chamber between the target 19 and the wafer surface by the introduction of a glow discharge of argon (Ar) gas into the chamber. In order to create $WSi_x$ sputtering from the target 19, and deposition of the first film 12 within the via 11, the DC power source 18 is activated to typically generate 1 kW to 5 kW of power. The RF power source 24 to the W-coil is either not activated or activated to generate a small power source in the range of less than 0.5 kW. The RF power is minimal, so the sputtering that takes place within the chamber is essentially a standard PVD process, with the exception of the increased distance between the target and wafer surface. In this case, only $WSi_x$ is sputtered from the target 19 and very little material is sputtered from the W-coil 20. In addition, the power source 24 to the semiconductor wafer 22 is also applied to bias the wafer surface 25 to accelerate attraction of any WSi$_x$ atoms to the wafer surface. In this manner, WSi$_x$ is deposited as a first film 12 within the contact hole or via 11.

The target 19 may comprise of WSi$_x$ in which the composition has a molar ratio of Si:W that is greater than 2:1. Accordingly, the molar ratio of Si:W in the first film is greater than 2:1. Such a ratio is greater than 2.5:1 in a conventional target.

In a second step, the rf-power supply 26 to the coil 20 is increased between 0.5 to 2 kW, and the dc-power supply 18 to the target 19 is decreased or simply eliminated. In order to make the transition to this second phase, the dc-power supply 18 to the target 19 may be gradually decreased as the rf-power supply to the coil 20 is generally increased to a desired, or preselected output. Tungsten is sputtered from the coil 20 and overlays the first film 12. Thus, the deposition of the W results in a net erosion of the coil. Moreover, any sputtering that may occur from the target 19 may create tungsten ions, which may also agglomerate and form the W film.

Additional layers of WSi$_x$ and W may be added as desired to complete the barrier layer 15. As illustrated in FIG. 5, a third film 12B (or a second tungsten silicide film) is disposed between the W-film 13 and the W-plug 14.

Figure 7:
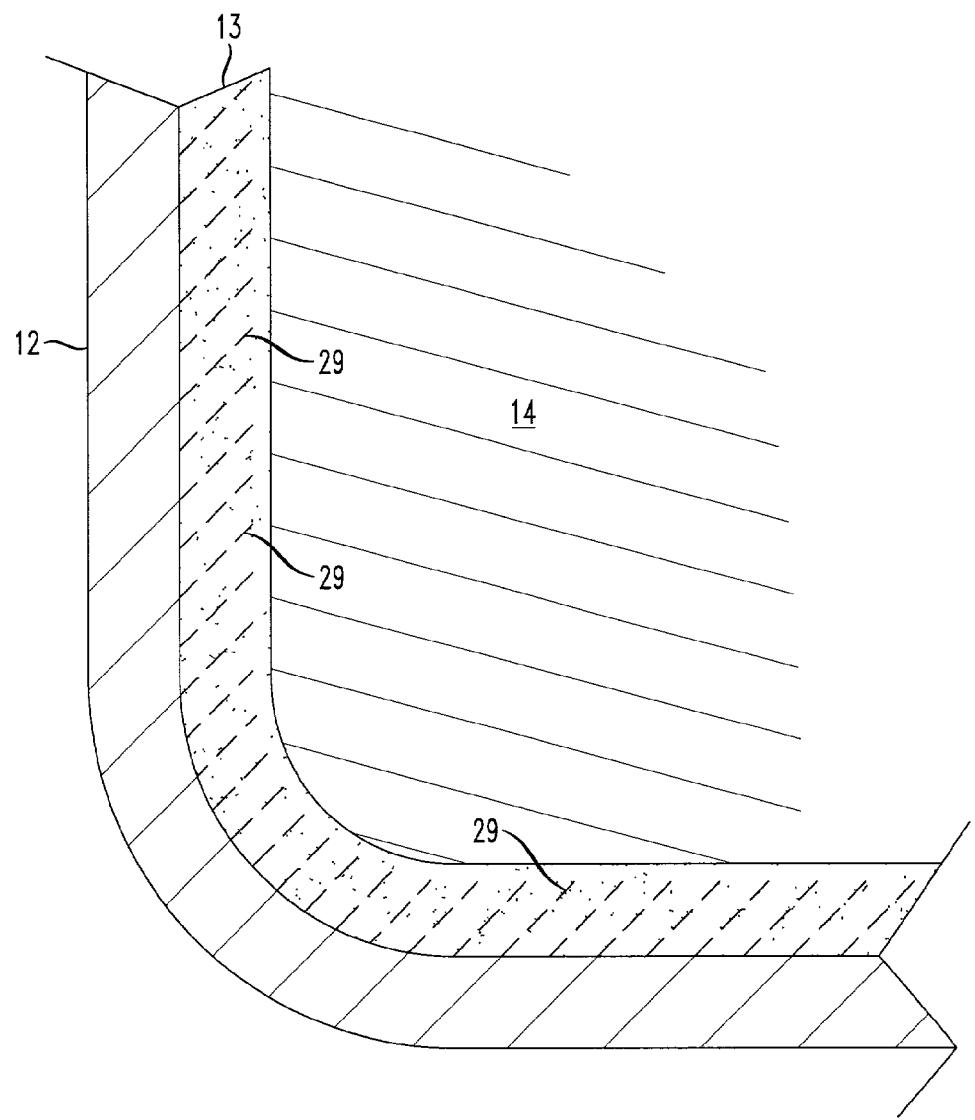
FIG. 7 is an expanded view of the barrier layer showing the $WSi_x$ gradient across the barrier.

It should be noted that during the sputtering phase of the WSi$_x$ from the target 19, WSi$_x$ may collect or agglomerate on the coil 20. Thus, when the coil 20 is activated and sputtering of W from the coil 20 is initiated, WSi$_x$ atoms may sputter from the W-coil and agglomerate on the first film 12 and within the second film 13. Thus, a WSi$_x$ gradient is created within the W film 13 of the barrier layer 15. The gradient is represented by the dashed lines 29 across the W film 13, as shown in FIG. 7. The W-plug 14 is then deposited within the contact or via 11 over the second film 13 using a CVD procedure.

Typical film thickness range for the first film 12 is approximately 150 to 250 A, and for the second film 13 ranges between 100 to 300 A. Those skilled in the art will appreciate the fact that the individual thickness of each of the films 12 or 13 is eventually determined by their barrier layer efficacy and integrity, as well as their ability to provide a good nucleation for the W-plug deposition.

The use of a W-based film barrier layer prevents issues associated with "volcano" formation that is common with Ti/TiN barrier deposition, and prevents frequent "pasting" within the deposition chamber. Moreover, a barrier layer with a chemical and microstructural gradient across its thickness allows stress accommodation by providing transition between the constituent films. Furthermore, the use of tungsten-based films within the barrier layer 15, as disclosed in the present application, provides a barrier that is crystallographically iso-structural with the W-plug 14 that is to be subsequently deposited. Therefore, these W-based films (the first film 12 and second film 13) provide a quasi-epitaxial substrate for a W-plug formation, allowing easy nucleation and growth of the W-plug.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

We claim as our invention the following:

1. An interconnect structure, comprising:
    (a) a substrate having disposed thereon a topographical structure including a dielectric material and a recess formed therein;
    (b) a tungsten silicide film disposed along a surface of the recess;
    (c) a tungsten film overlaying said tungsten silicide film;
    (d) a tungsten plug deposited within the recess; and
    (e) a second tungsten silicide film disposed between the tungsten film and tungsten plug.

2. The interconnect structure of claim 1 wherein a tungsten silicide gradient is deposited within said tungsten film.

3. The interconnect structure of claim 1 wherein said tungsten silicide film is deposited from a tungsten silicide target utilizing a sputtering procedure conducted in a deposition chamber.

4. The interconnect structure of claim 3 wherein said tungsten film is deposited from a tungsten coil utilizing a sputtering procedure conducted within a deposition chamber.

5. The barrier layer of claim 1 wherein said tungsten silicide film has a silicon to tungsten (Si:W) ratio greater than 2:1.

6. A method for forming a barrier layer on an interconnect structure, comprising the steps of:
    forming a first tungsten silicide film within a recess formed on a topographical structure on a semiconductor substrate;
    forming a tungsten film onto said first tungsten silicide film;
    forming a tungsten plug within said recess and over said tungsten film; and
    forming a second tungsten silicide film, within the recess, between the tungsten film and the tungsten plug.

7. The method of claim 6 wherein the step of forming the first tungsten silicide film of the barrier layer includes sputtering the tungsten silicide from a tungsten silicide target in a deposition chamber.

8. A method for forming a tungsten plug on a semiconductor device having a dielectric material formed over a substrate and a recess formed in the dielectric material, and said tungsten plug to be formed within the recess, the method comprising the steps of:
    (a) conformally depositing tungsten silicide at a predetermined deposition rate to a substantially uniform predetermined thickness along walls of the recess to form a first film;
    (b) conformally depositing tungsten to a substantially uniform predetermined thickness over the tungsten silicide within the recess while reducing the rate of deposition of the tungsten silicide for the first film at about the same time as, or after starting the deposition of tungsten for the second film within the recess and, after said tungsten silicide reaches said predetermined thickness thereof to form a second film;
    (c) depositing tungsten silicide within the recess while said tungsten is being depositing within the recess thereby forming a tungsten silicide gradient within said second film; and,
    (d) depositing tungsten within the recess over the second film to form said tungsten plug.

9. The method of claim 8 further comprising the steps of providing a chamber within which the deposition of the tungsten silicide and tungsten takes place; positioning the semiconductor device within the chamber; providing a tungsten silicide target and a tungsten coil within the chamber; and, generating a plasma within the chamber adjacent the semiconductor device for the sputter deposition of tungsten silicide from the target and the sputter deposition of tungsten from the coil.

* * * * *